US006201240B1

United States Patent
Dotan et al.

(10) Patent No.: US 6,201,240 B1
(45) Date of Patent: Mar. 13, 2001

(54) SEM IMAGE ENHANCEMENT USING NARROW BAND DETECTION AND COLOR ASSIGNMENT

(75) Inventors: Noam Dotan, Givatayim; Sergio Serulnik, Kfar Sava; Dubi Shachal, Rechovot, all of (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/186,268

(22) Filed: Nov. 4, 1998

(51) Int. Cl.[7] .................................................. H01J 37/244
(52) U.S. Cl. .......................... 250/310; 250/311; 250/397; 250/492.2
(58) Field of Search .................................. 250/310, 311, 250/397, 492.2

(56) References Cited

U.S. PATENT DOCUMENTS

| | | | |
|---|---|---|---|
| 3,628,014 | 12/1971 | Gruble, Jr. ........................... | 250/49.5 |
| 4,041,311 | 8/1977 | Martin .................................. | 250/311 |
| 4,560,872 | * 12/1985 | Antonovsky ......................... | 250/310 |
| 4,689,555 | * 8/1987 | Brust et al. ......................... | 324/158 R |
| 5,212,383 | 5/1993 | Scharf .................................. | 250/310 |
| 5,644,132 | * 7/1997 | Litman et al. ....................... | 250/310 |
| 6,066,849 | * 5/2000 | Masnaghetti et al. ............... | 250/310 |

OTHER PUBLICATIONS

"Color Voltage Contrast: A New Method of Implementing Fault Contrast With Color Imaging Software", J. Colvin, ISTFA '95, 21st International Symposium, Nov. 6–10, 1995, pp. 305–310.
"Colour Display of Video Information in Scanning Electron Microscopy: Principles and Applications to Physics, Geology, Soil Science, Biology and Medicine", Saparin et all, Scanning vol. 10, 87–106, Dec. 1987, pp. 87–106.
"Colour Micrographs for Backscattered Electron Signals in the SEM", G.D. Danilatos, Scanning vol. 8, 9–18 Sep. 1, 1985; pp. 9–18.
"Colour Encoding of Video Signals in SEM", Rau, et al; Scanning vol. 3, 3 (1980); pp. 242–248.
"A Method for Preparing Colored Scanning Electron Micrographs Using SE and BSE Images"; Tanaka, Scanning vol. 3, 3 (1980); pp. 206–219.
"Early Use of Colour–Modulation SEM:"; Pawley, et al; Scanning vol. 3, 3 (1980), pp. 161–164.
"Color Conversion in Electron Microscopy"; Crewe, Scanning vol. 3, 3 (1980); pp. 176–181.
"Detector Strategy forv Improvement of Image Contrast Analogous to Light Illumination", L. Reimer et al, Scanning, vol. 6, pp. 155–168 (1984) pp. 156–167.
"Real–Color Cathodoluminescence Scanning electron Microscopy—A New Effective Method for Study of SiC Materials and Devices"; Saparin et al, Scanning vol.18 pp. 25–34.
"Measuring the Performance of Scanning Electron Microscope Detectors"Joy et al; Scanning vol. 18 pp. 533–538.
"Topographic and Material Contrast in Low–Voltage Scanning Electron Microscopy", J. Heina Scanning vol. 17 pp. 387–394 (1995).

* cited by examiner

Primary Examiner—Teresa M. Arroyo
Assistant Examiner—Nikita Wells
(74) Attorney, Agent, or Firm—McDermott Will Emery; Michael A. Messina

(57) ABSTRACT

Disclosed is a system and method for enhancing edge, topography, and materials in SEM images. The enhancements are achieved by collecting secondary electrons at narrow energy bands. This allows construction of various "primary" images having specific features enhanced. Further enhancement is achieved by various manipulations and combinations of the "primary" images to obtain a final enhanced image. Yet further enhancements are achieved by assigning color to various "primary" images before constructing the final image.

24 Claims, 8 Drawing Sheets

SEM IMAGE ENHANCEMENT USING NARROW BAND DETECTION AND COLOR ASSIGNMENT

FIELD OF THE INVENTION:

The present invention relates to scanning electron microscopes (SEM) and, more particularly, to enhancing images of SEM using narrow band detection and color assignment. The invention is particularly useful in the general field of inspection and review of defects in the semiconductor wafers fabrication process.

BACKGROUND OF THE INVENTION

Scanning electron microscopes (SEM) are very useful for imaging very small elements on a sub-micron scale, with a resolution on the order of nanometers. Therefore, various SEM systems are used in the semiconductor industry for engineering and metrology. Recently, much attention has also been given to the use of SEM in investigation of defects on semiconductor circuits. Since the size of defects of interest (i.e., killer defects) continues to shrink with the shrinking of the design rules, there's a continuous need for improvement in the images obtained by such SEM.

As is well known to those skilled in the art, SEM images are obtained by directing a primary electron beam onto a sample, and using detectors to collect electrons returned from the sample. Some of these electrons are back scattered electrons (BSE) reflected as a result of elastic collisions. Others are secondary electrons (SE) emitted from the sample as a result of inelastic collisions. For better understanding of the discussion that follows, the reader's attention is directed to FIG. 1, depicting the energy spectrum of electrons emitted from a sample upon the impingement of a primary electron beam (the plot is adopted from Image Formation in Low-Voltage Scanning Electron Microscopy, L. Reimer, SPIE, Vol. TT12). It is conventionally accepted that collected electrons having energy up to 50 eV are SE, while collected electrons having energy above 50 eV are BSE.

SEM images have been traditionally provided as gray scale. However, for some time there has been an effort to provide color SEM images. Two basic methods have been employed for applying color to SEM images. The first method is based on the fact that the human eye is more sensitive to color variation than to shades of gray. Therefore, the gray scale was used to modulate color and it is sometimes referred to as color modulation. Another method was developed basically to better distinguish between features in two different signals (for example, one of SE and one of BSE). Thus, each signal was color coded and the resulting signals combined to obtain a color picture. The journal SCANNING has dedicated an entire issue to color SEM and much information about these systems is disclosed there—SCANNING, Vol 3, 3, (1980). One article in that issue, COLOR CONVERSION IN ELECTRON MICROSCOPY, by A. V. Crewe, aptly summarizes the advantages of color in SEM and the various techniques used for color SEM images.

As is known in the art, and as can be understood from the above noted works, SEM images are generally created from SE or BSE depending on the purpose of the study. That is, when the study requires the ability to distinguish between different materials in the sample, BSE detectors are used. See, for example, COLOUR ENCODING OF VIDEO SIGNALS IN SEM, E. I. Rau, et al., Id. On the other hand, when it is important to understand the topography of the sample, SE detectors are used. See, for example, U.S. Pat. No. 5,212,383 describing color modulation of wide energy band SE signals. Moreover, by assigning a certain color to a SE detector and another color to a BSE detector and then combing the images, one can obtain material and topography information in the same image. See, for example, A METHOD FOR PREPARING COLORED SCANNING ELECTRON MICROGRAPHS USING SE AND BSE IMAGES, K. Tanaka, Id.

However, in spite of the above efforts, there are still particular deficiencies of SEM images that are not addressed by these systems. These deficiencies are of particular interest to the semiconductor industry. One particular issue of importance to the semiconductor industry is a clear delineation of edges of features. For example, when one takes a SEM image of a bit line, it is important that the edges of the bit line be clearly displayed so that the edges can be investigated. Similarly, when one takes a SEM image of a defect, it is important to clearly distinguish the edges of the defect so that its boundaries can be determined.

Another issue of interest is clear contrast of materials. Specifically, theoretical and experimental works showed the capabilities of using BSE for distinguishing between heavy elements, but BSE lacked this capability for the light elements. Thus, a better method is needed for distinguishing between elements, especially when similar, light, elements are present within the investigated sample.

Voltage Contrast is a common way to test the electrical connectivity of features in the semiconductor industry. In one of the Modes of Voltage Contrast-Passive Voltage Contrast (PVC)—all the conductors that are grounded yield different signal from those that are not grounded. This happens because those conductors that are not grounded and float on the insulator are charged and they usually exhibits higher emission yield. There is a need to be able to enhance and diminish this effect on the resulting image, as needed for particular applications.

SUMMARY OF THE INVENTION

The present invention provides a system and a method for solving the above noted deficiencies of the prior art systems. Specifically, the disclosed invention allows for enhancement of the edges of a feature, enhancement of material contrast, topography contrast and the control of the contrast in the PVC mode of Voltage Contrast SEM images.

According to one feature of the present invention, at least two detectors are used to collect secondary electrons emanating from the sample. The detectors are controlled to collect a specific narrow band of secondary electrons, and the band of one detector is set to be different from the band of the other. Control of the bands of each detector allows for enhancements of various features, such as edge, material, and PVC contrast, in the resulting image. For example, edge contrast is enhanced by adjusting an SE detector to collect electrons of very low energy. On the other hand, topography enhancement is achieved by collecting SE at the higher end of the spectrum.

According to another feature, the various features are enhanced by using various combinations of the images obtained from the different detectors. For example, adding an edge enhanced image (slow electrons) to a topographic enhanced image (fast electrons) provides an image wherein both the topography and edges are enhanced.

Detector location also influences the resulting image. For example, if a secondary detector is placed at a relatively large angle to primary beam, shadow effects can be obtained, much in the same way as if one was to illuminate the feature from the side with a flash light. The bandwidth of such a detector can also be controlled to obtain topography enhancement. Moreover, combining the image of such a detector with edge enhanced and material enhanced images can provide a single image wherein the edges, material, and topography features are enhanced.

Another feature of the disclosed invention resides in color coding the images obtained from the narrow band SE detectors. Specifically, as noted above, combining the images of the various narrow band SE detectors results in an overall enhanced image. However, such an image includes much information that is hard to perceive in a gray scale. Therefore, according to the present invention, various color coding is used to allow the human eye to better appreciate the vast amount of information resulting from the combination of the various images.

BRIEF DESCRIPTION OF THE DRAWINGS

FIG. 3A is a SEM image obtained by collecting slow SE, while

FIG. 6A is a voltage contrast image taken with fast SE, while

DETAILED DESCRIPTION OF SPECIFIC EMBODIMENTS

Figure 1:
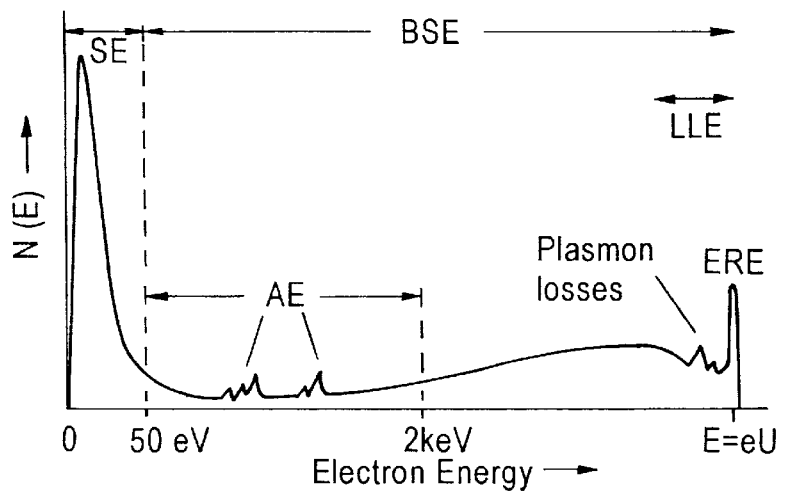
FIG. 1 is a plot of the energy spectrum of electrons emanating from a sample.
Figure 2:
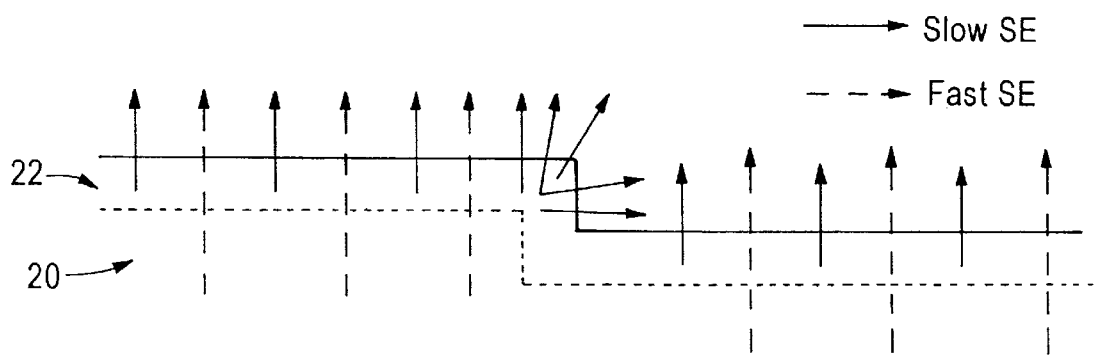
FIG. 2 is a schematic illustrating emission of SE from a sample.

The present invention can be better understood in view of the following discussion, with reference to FIG. 2. An important feature of the invention is based on the observation that SE of different energies contribute to different phenomena enhancement in the image. Specifically, the slower electrons contribute more to edge contrast enhancement, and faster electrons contribute more to the topography contrast enhancement.

As exemplified in FIG. 2, slow electrons can be emitted from the bulk (generally indicated at 20) only when they are close to the surface. Therefore, the volume from which these electrons are emitted is limited to a thin (few nanometers) layer bellow the surface (generally indicated at 22). However, near the edges (corners) low energy electrons have more possible short ways to leave the bulk. Therefore, the amount of low energy SE emanating from the bulk is increased when the scan reaches a feature edge.

On the other hand, the emission of the high energy electrons is not confined to the edges. Thus, high energy SE do not contribute much to edge enhancement. That is, the penetration of the primary beam and the excitation of the fast secondary relates to the slope of the bulk's surface. Thus, collection of fast SE reveals information relating to the surface topography.

Figure 3A:
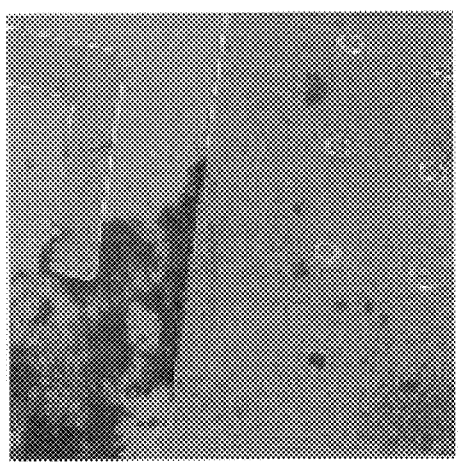
Figure 3B:
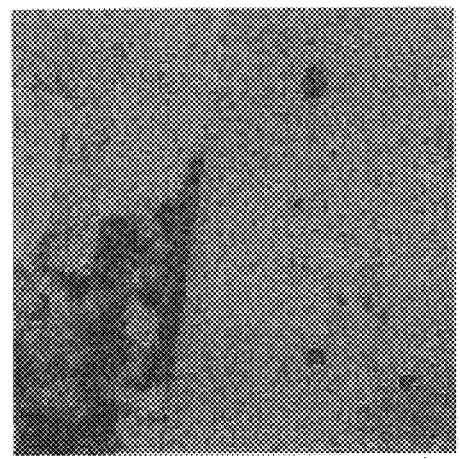
FIG. 3B is a SEM image of the same sample, but obtained by collecting fast SE.

Consequently, when one mixes slow SE with fast SE, as is done in conventional SEM systems, the edge effect is degraded. This is vividly depicted in FIGS. 3A and 3B. The image in FIG. 3A was obtained by collecting slow SE, while the image obtained in FIG. 3B was obtained by collecting fast SE. As can be seen in FIG. 3A, edge contrast are enhance and appear as bright lines when the image is formed by collecting only slow SE.

Figure 4:
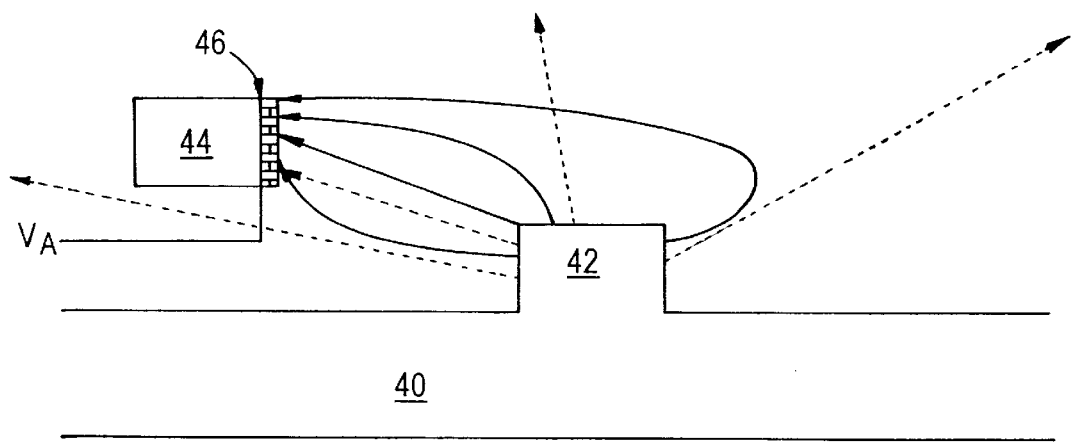
FIG. 4 is a schematic diagram depicting the influence of attractive field on slow and fast SE.

However, slow SE degrade topography information. This is because it is a general practice to provide an attractive field to attract SE to the detector. This field drastically influences slow SE and changes their trajectory, thus blurring topography information. This is demonstrated in FIG. 4, wherein the substrate is indicated at 40 and a feature on the substrate is indicated at 42. A potential $V_A$ is applied to grid 46 of detector 44. This potential drastically influences the trajectory of slow SE (indicated in full arrows), while it has minimal effect on fast SE (indicated in broken arrows). Thus, in order to obtain topography enhanced image, it is better to collect a narrow band of fast SE.

Collecting secondary electrons at narrow bands can also assist in enhancing material contrast. It is generally accepted that it is difficult to obtain material contrast from SE. This is because the total SE emission efficiency of many materials is almost the same. Thus, generally BSE are used for material enhancement. Alternatively, one obtains energy spectrum, such as Auger spectrum to identify all of the materials present in the sample. This, however, is a very time consuming operation and is impractical for in-line monitoring systems.

Figure 5:
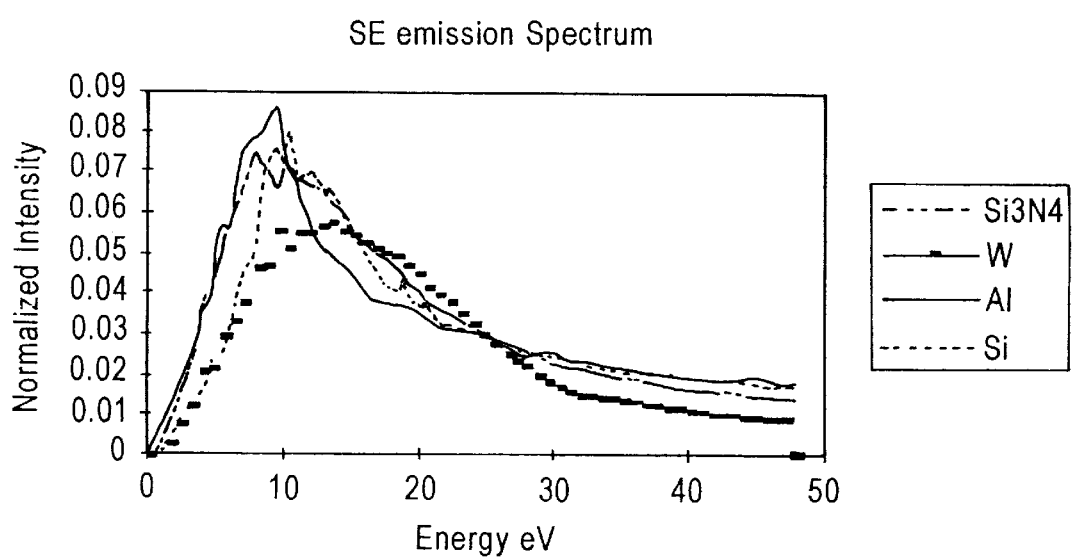
FIG. 5 is a plot of the emission spectrum of various materials.

However, if one plots the SE emission spectrum, as shown in FIG. 5, one can select narrow bands of SE to increase the material contrast. For example, as shown in FIG. 5, one can select a narrow band of slow SE to increase the contrast between silicon and silicon nitride. Moreover, in the application of in-line monitoring, it is known beforehand what materials should be present in the sample. For example, in the semiconductor industry, a limited number of insulators and conductors are used, and one knows for each process steps which materials will be present at the surface of the sample. This factor is the basis for an advantageous feature of the present invention.

Specifically, according to the present invention, a library (or a look-up table) is created for the SE spectrum of the limited number of materials used in the semiconductor industry, e.g., Si, $SiO_2$, $SiN_2$, Ti, W, Al etc. Then, during the in-line inspection process, one can obtain a series of images, each of a different narrow band SE, thereby constructing a spectrum of SE energy band for each material on the sample. Thus, an easy and fast method of obtaining material information is obtained. Moreover, if the spectrum of a particular section of the sample does not match the library, it is an indication that a defect exist, which is formed of a foreign matter.

Figure 6A:
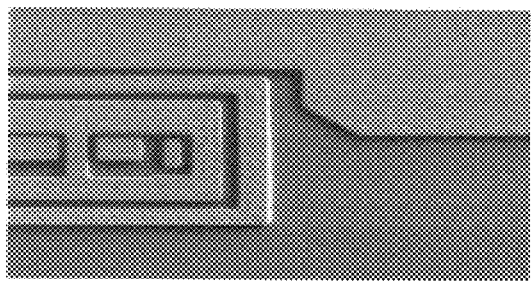
Figure 6B:
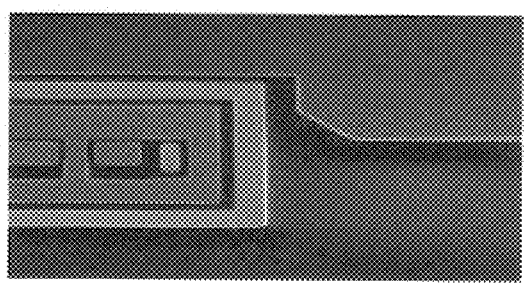
FIG. 6B is a voltage contrast image taken with slow SE.

Separation to narrow bands also enhances voltage contrast. Specifically, when a conductor is not grounded, but rather floats on an insulator, gets charged by the primary beam and consequently exhibit higher or lower emission yield. However, the emission spectrum changes only slightly. Thus, collection of slow electrons enhances this contrast, while collection of fast electrons diminishes this contrast. This effect is dramatically enhanced in FIG. 6B, taken with slow SE, while it is lacking in FIG. 6A, taken with fast SE.

Therefore, it is a feature of the invention that various images are obtained by collecting SE narrow bands. The discussion below provides certain embodiments of SEM detector arrangements for collecting SE in narrow, selectable bands.

Figure 7:
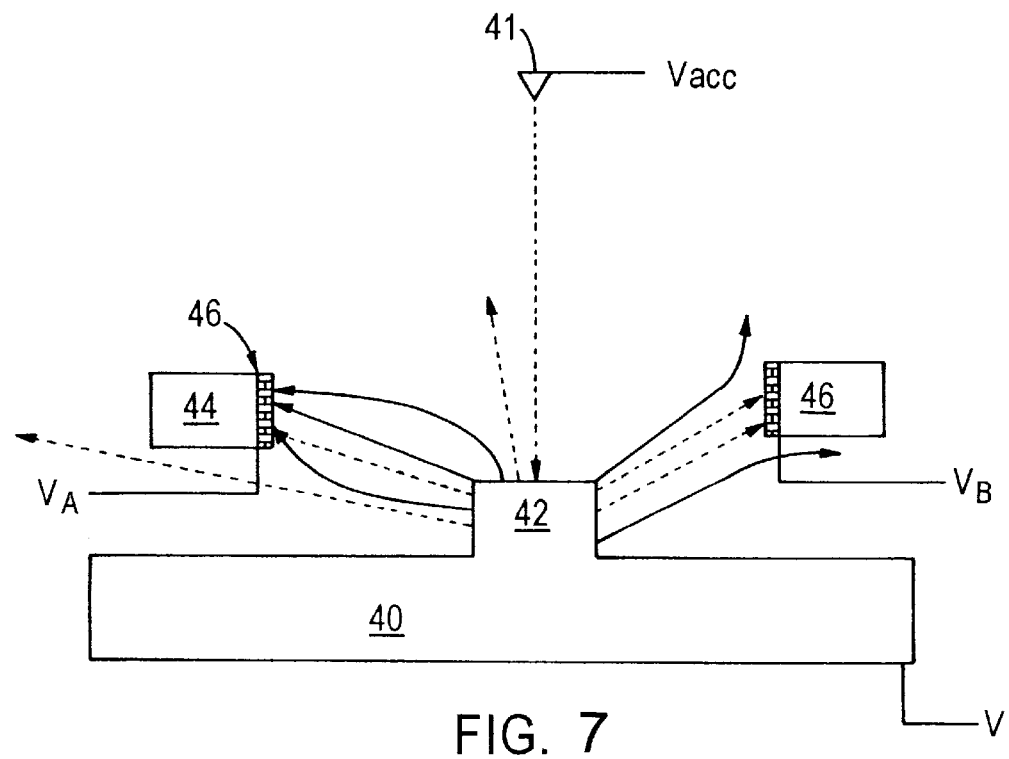
FIG. 7 is a schematic diagram of narrow band SE SEM microscope according to an embodiment of the present invention.

The reader's attention is now directed to FIG. 7, exemplifying a first embodiment of the present invention. The primary beam is emitted from source 41 having acceleration voltage Vacc applied thereto. The sample, 40, is held at voltage $V_3$, which may be ground. Two SE detectors are shown, 44 and 46. Detector 44 has a relatively weak attractive potential, $V_A$, (e.g., 100V) applied to its grid, thereby attracting a narrow band of slow SE. On the other hand, detector 46 has a relatively weak repulsive potential, $V_B$, (e.g., −1 to −10 volts) applied to its grid, thereby repelling slow SE and admitting only fast SE. Using such an arrangement, one can adjust the potentials $V_A$ and $V_B$ until optimum images are obtained, depending on the particular situation at hand. As can be appreciated by those skilled in the art, these potentials will have direct correlation to the bandwidth sought to be collected. Notably, a single detector can be used to obtain several images of narrow SE bands by changing the grid voltage for each image.

Figure 8:
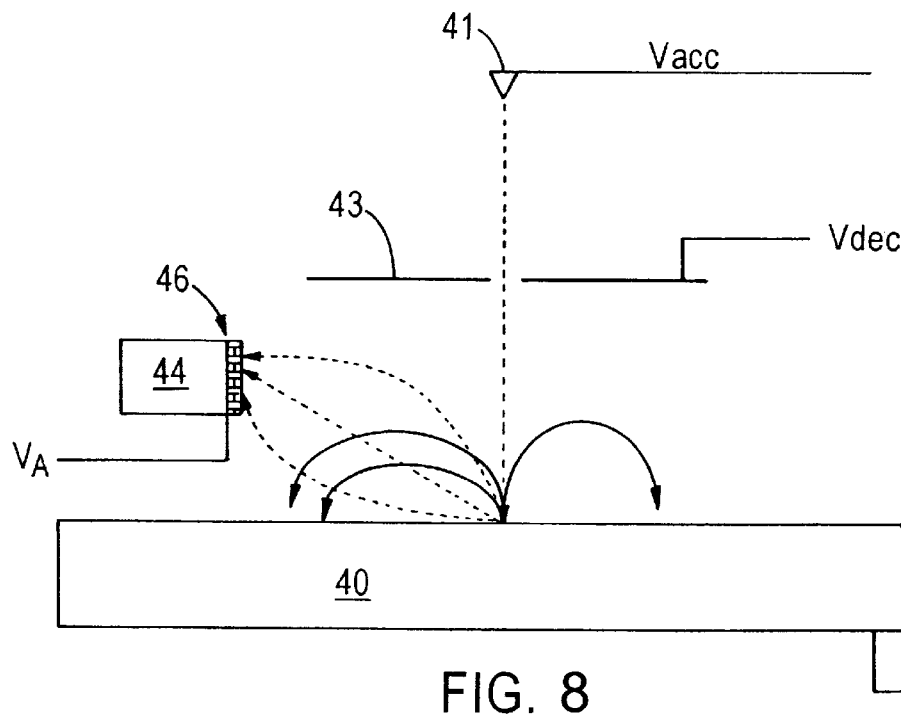
FIG. 8 is a schematic diagram of narrow band SE SEM microscope according to another embodiment of the present invention.

Another embodiment for collecting narrow band is exemplified in FIG. 8. The general structure of the embodiment of FIG. 8 is similar to that of FIG. 7, except that a decelerating electrode 43 has been added. Such an electrode is described in U.S. Pat. No. 4,831,266, and is generally used to decelerate the primary beam electrons from the Vacc potential to the Vdec potential. It is conventional in the prior art to apply a constant accelerating voltage, Vacc, to the electron source, hold the sample at a constant potential V3, and apply a decelerating voltage Vdec as appropriate under the particular circumstances. For example, Vacc can be −1K volts, Vdec, −100 volts, while V3 can be ground, i.e., the sample is at ground, i.e., zero potential, with respect to the electrons emanating from the source. It should also be noted that the amplitude of the potential at the source with respect to the sample has negligible effect on the emission spectrum of the SE from the sample.

In view of the above, one can obtain an image by collecting SE at selected energy range by applying an attractive potential to the sample, i.e., changing the voltage of V3. For example, if a potential of positive ten volts is applied to the sample, practically all SE of energies below 10 eV (depicted in full arrows) will be attracted back to the sample and will not reach the detector. Only SE having energy above 10 eV (depicted in broken arrows) will be able to escape this attractive force and reach the detector. Appropriate selection of the voltage on V3 can be used for selecting the optimal bandwidth for a particular situation. Changing Vdec also changes the electric field in the vicinity of the sample and can be used to control the emission of the SE from the sample in the same manner as V3. A negative potential of Vdec will repel SE and prevent them from reaching the detector. This embodiment is particularly beneficial for enhancing the contrast between insulators floating conductors, and grounded conductors. Specifically, since the slow SE will return to the sample, insulators and floating conductors will get charged, while grounded insulators will dispose of their charge. Thus, the contrast in the image will increase.

The method exemplified in FIG. 8 has a certain disadvantage. That is, when the potential on the sample is changed, the microscope goes out of focus and needs to be refocused. While this may be only a minor nuisance in a laboratory microscope, it can adversely reduce the throughput of an in-line inspection and metrology systems. According to the present invention, this problem is solved by making the same voltage change on the acceleration voltage Vacc. For example, when the power supply is directed to apply a 10 volts potential to the sample, i.e., V3, it would also change the accelerating voltage, Vacc, by 10 volts. This will ensure that the sample remains in focus.

Figure 9:
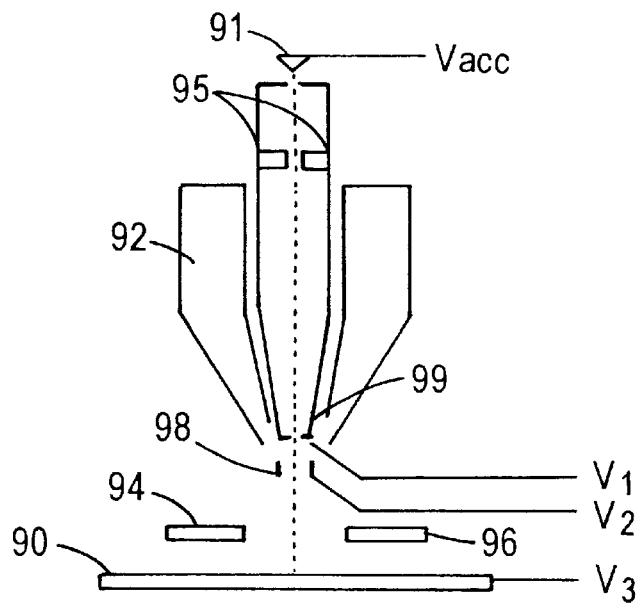
FIG. 9 is a schematic diagram of narrow band SE SEM microscope according to the preferred embodiment of the present invention.

A preferred embodiment of the invention is depicted in FIG. 9. A sample 90 is investigated with a SEM having electron source 91 and an objective lens 92. Two electrodes, 98 and 99, are provided at the tip of the lens 92. In the preferred embodiment three detectors are used, external detectors 94 and 96, and internal (i.e., inside the electron column) detector 95. Generally, the objective lens 92 can be according to the design disclosed in U.S. Pat. No. 4,785,176 and 4,831,266. Internal detector 95 can be according to the design disclosed in U.S. Pat. No. 5,466,940 and 5,644,132. External detectors 94 and 96 can be any "off the shelf" detectors, such as Everharet-Thorenly detectors.

As shown in FIG. 9, accelerating potential Vacc is applied to the electron source 91, and potentials $V_1$ and $V_2$ are applied to electrodes 98 and 99 (Electrode 99 extends from the electron gun to the bottom of the objective lens and forms the retarding field for the primary electron beam; nevertheless, its induce field at the sample area acts to collect SE towards the detector 95). The sample is at potential V3. Potentials $V_1$ and $V_2$ are variables and create an electrostatic field above the sample. This field attracts SE into the lens and towards the internal detector 95. Of course, the energy bandwidth of SE which will be influenced by this field depends on the strength of the field, i.e., potentials $V_1$, $V_2$ and $V_3$. That is, the field can be adjusted to attract slow SE inside the column, thereby preventing them from reaching the outside detectors 94 and 96. Fast SE will have sufficient energy to escape the field and will not enter the column, but rather reach the external detectors 94 and 96. Thus, by properly adjusting the field, the slow SE can be detected by the internal detector, while the fast SE can be detected by the external detectors.

Figure 13A:
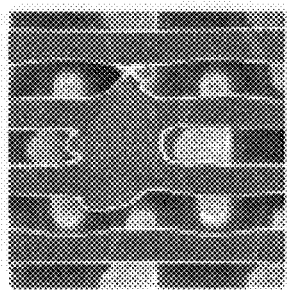
FIGS. 13a–13c depict material enhanced image obtained from the internal detector, and topography and shadow effects enhanced images obtained from the left and right external detectors, respectively.
Figure 13B:
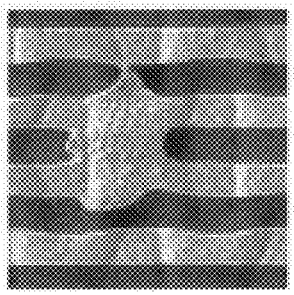
Figure 13C:
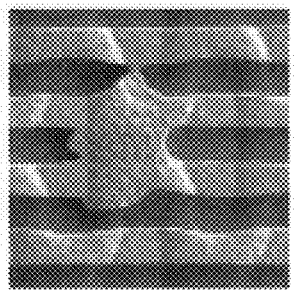

Using this approach, one can obtain an edge and material enhanced image from the internal detector, and topography and shadow effects enhanced images from the external detectors. This is dramatically evidenced in FIGS. 13a–13c. The image depicted in FIG. 13a was obtained from the internal detector, and has high material and edge contrast. The images of FIGS. 13b and 13c were obtained from detectors 94 and 96, respectively. These images have high topography contrast and since they were generated by the two external detectors that were positioned in opposite direction relative to the electron beam, the shadow content is complementary in each of them (i.e. a shadow in one image turns to be bright in the other image)

Figure 10:
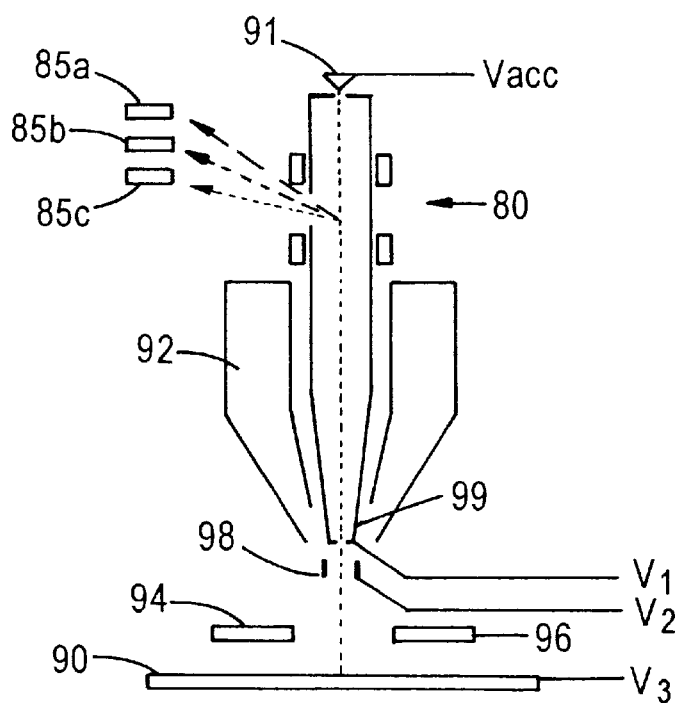
FIG. 10 is a schematic diagram of narrow band SE SEM microscope according to yet another embodiment of the present invention.

Yet another embodiment for collecting narrow energy bands of SE is depicted in FIG. 10. In the system depicted in FIG. 10, a filter, generally indicated at 80, is introduced inside the column. Such a filter is constructed similar to a Wien filter, such as those described in U.S. Pat. No. 4,019,989; 4,818,872; and 4,812,651, which are incorporated herein by reference. However, unlike the prior art Wien filter, in the embodiment exemplified the bending field is applied so that it has maximum effect on the slowest electrons and least effect on the fastest electrons. This can be done by appropriate placement of deflection coils and selection of applied voltages, as is well known to those skilled in the art. Thus, by placing several detectors, 85a, 85b and 85c in this example, one can collect narrow energy bands of SE in each detector. Alternatively, a conventional Wien filter can be used and the detectors 85a, 85b and 85c replaced by an electron spectrometer, such as that described in U.S. Pat. No. 4,812,651.

Further image enhancements can be obtained by appropriate manipulation of the separate images obtained according to the embodiments described above. These enhancements will now be described with reference to the preferred embodiment depicted in FIG. 9, and further exemplified in FIG. 11. In the following, detector 94 will be referred to as the left detector, while detector 96 will be referred to as the right detector. It will also be assumed that the electrostatic field has been adjusted so that the internal detector has collected slow electrons, thus obtaining an image with edge and material enhancement, while the external detectors have collected the faster electrons, thus obtaining an image with topography and shadow effects enhancements.

Figure 11:
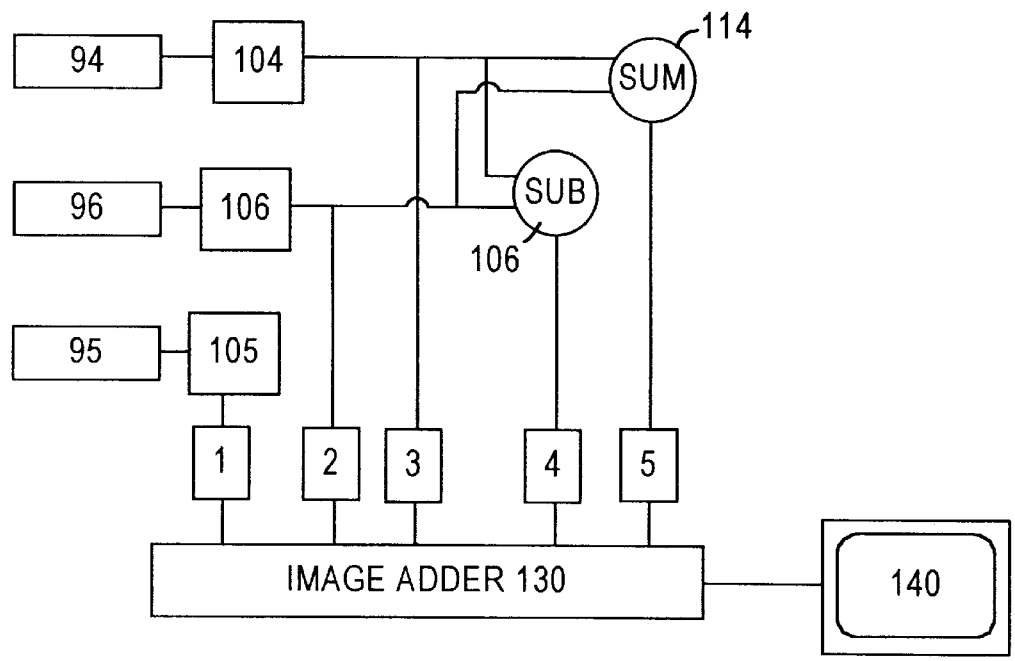
FIG. 11 is a block diagram depicting signal manipulation for further image enhancement of the embodiment of FIG. 9.

As also indicated in FIG. 11, the signal output by each detector is first "grabbed" by grabbers 104, 105 and 106. The term "grab" in this context refers to the signal processing required to digitize the analog signal output by the detectors. The grabbing of the images at early stage provides many benefits over the prior art analog systems. Notably, unlike the prior art systems wherein every operation was carried upon the entire image, in the present approach each pixel in the image can be dealt with independently of the rest of the image. Thus, for example, one can easily operate on the histogram or consider only parts of the image (such as defects or features appearing in the picture).

Figure 14A:
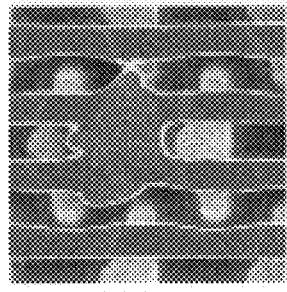
FIGS. 14a–14c depict the internal detector, the external subtraction, and the external sum images obtained by the embodiment of FIG. 11, respectively.
Figure 14B:
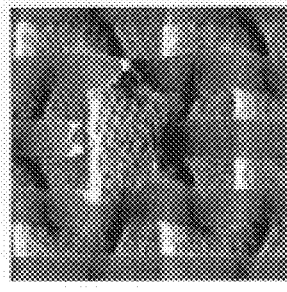
Figure 14C:
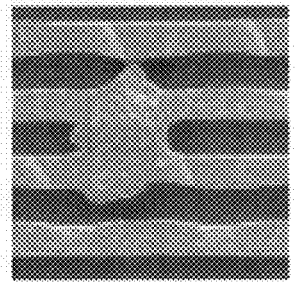

In the preferred embodiment depicted in FIG. 9, the external detectors are spaced 180° apart. Consequently, the shadows effects in the images obtained by these detectors are complementary. Therefore, two additional images can be created; namely, the sum and difference of the images of the two external detector. Therefore, in the preferred embodiment exemplified in FIG. 11, once the images have been grabbed, the signals from the left and right detectors are sent to adder 104 and subtractor 106. The sum of the images provides the image less the shadows effects, while the difference provides only the shadows effects. The resulting images are depicted in FIGS. 14a–14c; 14a being the internal detector, 14b the external subtraction, and 14c the external sum.

Notably, the sum and difference operations need not be simple algebraic operations. For example, in the preferred implementation, the adder 104 actually averages the signals, i.e., adds left to right and divides by two. On the other hand, a bias is added to the signal form the subtractor 106. Other options are available for obtaining the sum and difference, such as using weights and any other statistical and or algebraic operators.

With this set of five images, 1–5, one can now obtain various images in which certain features are enhanced and/or combined. In FIG. 11, this is exemplified by the use of an image adder 130 which output its signal to a screen 140. In the preferred implementation, the image adder 130 produces a material contrast enhanced image by combining images 1 and 5; a topography enhanced image by combining images 4 and 5; and a material and topography enhanced image by combining images 1 and 4. Moreover, a variably controlled image is obtained by varying the variable G in the following combination:

$$\text{Enhanced Image} = \boxed{5} + G*\boxed{4} + (1-G)*\boxed{1}$$

Of course, if the user programs a range and step size for the variable G, the system can automatically output a series of images varying from material contrast to topography contrast enhancements. It should be appreciated that the various images can be displayed on one screen by dividing the screen appropriately, displayed on several screens, or printed out.

Additionally, when collecting slow SE to obtain edge enhancement, the signal at the edges of a feature is actually too strong as compared with the rest of the image. Therefore, it is preferable to somewhat attenuate the brightness of the signal at the edges. Since, as noted above, the signal is grabbed after it is output from the detector, the attenuation can be easily achieved by, for example, non-linearly stretching the histogram of the image obtained from the slow SE detector.

Figure 12:
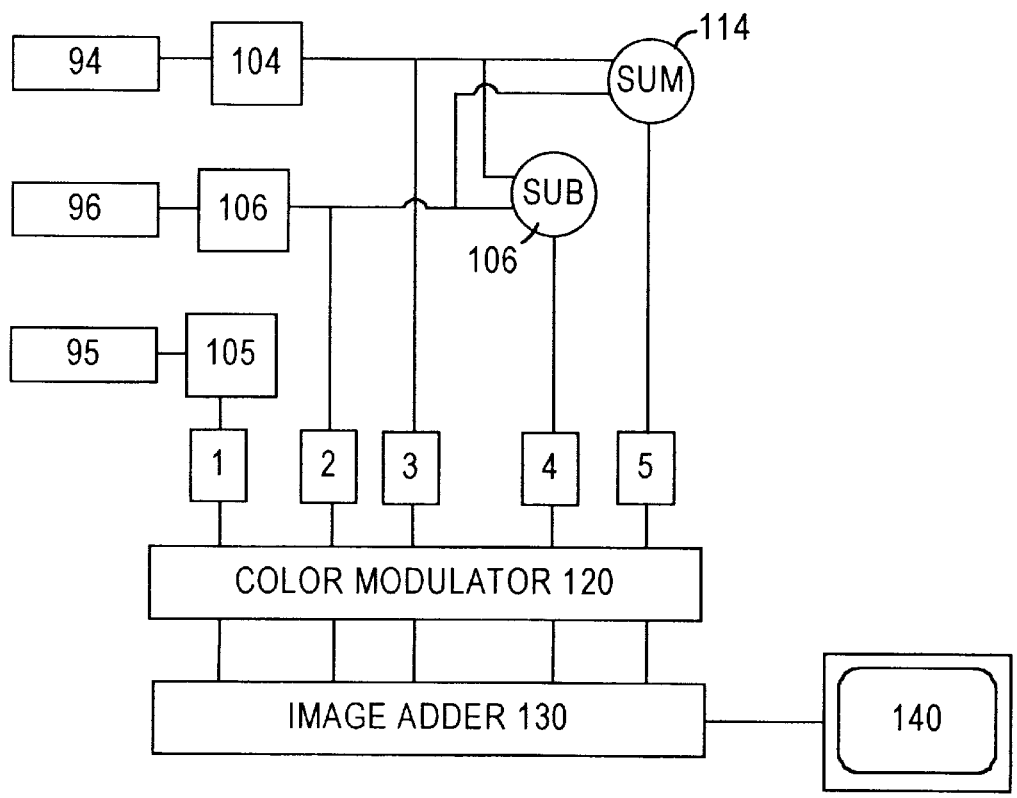
FIG. 12 is a block diagram depicting an embodiment for applying color to the signal of the embodiment of FIG. 11.

The above noted features of the present invention provide various gray-scale images with various aspects enhanced. A further improvement of the image enhancement will now be described with reference to FIG. 12. Specifically, the embodiment exemplified in FIG. 12 includes all of the gray-scale elements of the embodiment of FIG. 11, but has additional elements to apply color to the images. As shown in FIG. 12, each of the digitized images, 1–5, is input to a color modulator 120 in which a specific color is assigned to each image of the input images 1–5. The color-assigned images are then input to the image adder 130, which performs the image combinations as described above (e.g., addition and subtraction of two images). The result is output as a color image to be displayed on a CRT 140 or printed as a color image.

In the preferred embodiment, the material enhanced image (i.e., the internal detector signal) is assigned with a bluish color. The topography enhanced image, i.e., the external sum signal, is assigned with a red-orange color, and the shadow effects, i.e., the external subtraction signal, is assigned a natural gray color. These three images are combined to obtained an image that is pleasing to the eye, yet enhances important information to the user.

Also, for material analysis, one can implement a per pixel coding scheme that assigns gray scale or colors corresponding to SE energy per pixel. That is, as noted above, the range of materials expected in samples such as semiconductor circuits is limited and the SE energy spectrum for each material can be catalogued. Thus, it will be very helpful to, for example, assign a color for each material, i.e., SE energy spectrum response. Then, for each pixel, the color assignment will be according to the SE spectrum response—thus coloring the entire image according to the materials present. A particularly highlighted color can be assigned to unrecognizable spectrum—thus highlighting defects of unknown composition.

While the invention has been described with reference to particular embodiments thereof, other embodiments, modifications, and implementations would be appreciated by those of ordinary skill in the art without departing from the invention's spirit and scope as defined by the claims appended herein.

What is claimed is:

1. A method for enhancing information in SEM images, comprising:
   a. causing a primary electron beam to impinge upon a sample;
   b. separately collecting secondary electrons emitted from the sample at least at two narrow bands of the secondary electron spectrum and providing two narrow bands image signals;
   c. digitizing said image signals; and
   d. combining the digitized image signals to obtain an enhanced image.

2. The method of claim 1, wherein step d is preceded by the step of:
   c-1 separately manipulating the digitized image signals to obtain enhanced image characteristics.

3. The method of claim 2, wherein the step of separately manipulating comprises performing a Gamma operation on histograms of the image signals.

4. The method of claim 1, wherein step d is preceded by the step of:
   c-2 separately assigning color to the digitized image signals.

5. The method of claim 4, wherein the step of separately assigning color is performed on a per-pixel basis.

6. The method of claim 1, wherein the step of combining comprises at least one of algebraic or statistical operations.

7. A method for enhancing information in SEM images, comprising:
   a. causing a primary electron beam to impinge upon a sample;
   b. collecting secondary electrons emitted from the sample and having energy at the lower end of the secondary electrons spectrum, obtaining a first signal therefrom, digitizing the first signal to obtain a first digitized image signal, and constructing a first image therefrom;
   c. collecting secondary electrons emitted from the sample and having energy at the upper end of the secondary electron spectrum, obtaining a second signal therefrom, digitizing the second signal to obtain a second digitized image signal, and constructing a second image therefrom;
   d. superimposing said first and second images.

8. The method of claim 7, wherein step d is preceded by the step of:
   separately manipulating the first and second digitized image signals to obtain enhanced image characteristics.

9. The method of claim 8, wherein the step of separately manipulating comprises performing a Gamma operation on the histograms of the image signals.

10. The method of claim 7, wherein step (d) is preceded by the step of:
    color encoding said first and second images.

11. The method of claim 7, wherein the step of combining comprises at least one of algebraic or statistical operations.

12. A method of SEM image enhancement comprising the steps of:
    a. storing a SE emission spectrum of selected materials;
    b. assigning color to each of said materials;
    c. obtaining a plurality of SE images taken at narrow bands of SE spectrum;
    d. digitizing said SE images;
    e. for a series of corresponding pixels in the images, comparing the SE emission response to the stored SE emission spectrum to determine the material present at the location represented by the corresponding pixels; and,
    f. selecting an appropriate assigned color for each of the corresponding pixel to obtain a color enhanced SEM image.

13. The method of claim 12, further comprising the steps of:
    b1. assigning a unique color to an "unidentified material";
    f1. when SE emission response of the corresponding pixels does not match any of the stored emission spectrums, assigning the unique color to these corresponding pixels to allow easy identification of foreign material.

14. An image enhancing SEM apparatus, comprising:
    an electron beam source having an acceleration potential applied thereto;
    a sample holder applying a sample potential to a sample disposed thereupon;
    a first narrow band SE detector;
    a second narrow band SE detector;
    an image grabber for grabbing signals output by said first and second narrow band SE detectors; and
    a display for displaying images grabbed by said image grabber.

15. The apparatus of claim 14, further comprising a decelerating electrode disposed between the electron beam source and the sample and having a decelerating potential applied thereto.

16. The apparatus of claim 15, wherein said sample potential further comprises a slow SE attractive potential calculated to cause slow SE to return to the sample.

17. The apparatus of claim 15, wherein said decelerating potential further comprises a slow SE repelling potential calculated to repel slow SE back to the sample.

18. The apparatus of claim 16, wherein the accelerating potential further comprises focus correction potential corresponding to said slow SE attractive potential.

19. The apparatus of claim 17, wherein the accelerating potential further comprises focus correction potential corresponding to said slow SE repelling potential.

20. The apparatus of claim 17, further comprising a color modulator for assigning color to said images.

21. An image enhancing SEM apparatus, comprising:
    a. an electron beam source having an acceleration potential applied thereto;
    b. an electron column providing a primary beam from said electron source;
    c. a sample holder applying a sample potential to a sample disposed thereupon;

d. at least one external narrow band SE detector situated outside said electron column;

e. at least one internal narrow band SE detector situated inside said electron column;

f. a decelerating electrode situated between said source and said sample, and having a decelerating voltage applied thereto;

g. an image grabber for grabbing signals output by said external and internal narrow band SE detectors; and h. a display for displaying images grabbed by said image grabber.

22. The apparatus of claim 21, further comprising an operator receiving said grabbed signals and operating thereupon to obtained an enhanced image.

23. The apparatus of claim 22, further comprising a color modulator receiving said enhanced image and applying color thereto.

24. The apparatus of claim 23, further comprising an image adder receiving a plurality of images from the color modulator and adding said images.

* * * * *